United States Patent [19]

McFayden

[11] 4,160,949
[45] Jul. 10, 1979

[54] AUTO-ZEROED OHMMETER

[75] Inventor: Dennis G. McFayden, San Diego, Calif.

[73] Assignee: California Instruments Corporation, San Diego, Calif.

[21] Appl. No.: 883,711

[22] Filed: Mar. 6, 1978

[51] Int. Cl.² .................................................. G01R 27/02
[52] U.S. Cl. .................................................. 324/62
[58] Field of Search .................................. 324/62, 57 R

[56] References Cited

U.S. PATENT DOCUMENTS

| 3,447,075 | 5/1969 | Williams, Jr. et al. | 324/62 |
| 3,895,376 | 7/1975 | Uchida | 324/62 X |

Primary Examiner—Stanley T. Krawczewicz
Attorney, Agent, or Firm—Brown & Martin

[57] ABSTRACT

An auto-zeroed ohmmeter is comprised of a current source having first and second leads for connection to respective terminals of an unknown resistor to generate first and second voltages at the terminals. A sensing circuit having third and fourth leads connects to the terminals of the unknown resistor and scales the first and second voltages to third and fourth voltages respectively. A ramp generator circuit is coupled to the sensing circuit and generates a ramp voltage with a slope proportional to the difference between the fourth voltage and a multiple of the third voltage. This ramp is generated for a time period of predetermined duration to thereby produce a reference point voltage at the end of the time period. Coupled to the ramp generator are circuits for reducing the reference point voltage at a predetermined rate, for measuring the time interval required to reduce the reference point voltage to the multiple of the third voltage, and for multiplying the measured time interval by a predetermined constant to compute resistance.

8 Claims, 6 Drawing Figures

AUTO-ZEROED OHMMETER

BACKGROUND OF THE INVENTION

This invention relates to electrical metering devices, and more particularly to electronic ohmmeters and multimeters. Various type ohmmeters exist in the prior art. One of these is the "Two Wire" ohmmeter. Basically a two wire ohmmeter is comprised of an operational amplifier having an input lead and an output lead for connection to respective terminals of an unknown resistance, and a current source connected to the input of the operational amplifier. In operation, the voltage at the operational amplifier output is sensed and used as a measure of the unknown resistance. A problem, however, with this ohmmeter is that the output voltage of the operational amplifier is not an accurate indicator of the unknown resistance. This is because the two leads which connect the terminals of the unknown resistance to the input and output terminals of the amplifier have resistance which adds to the unknown resistance. And thus, the output voltage of the amplifier is proportional to the unknown resistance plus the lead resistance, and the latter term causes error.

The prior art also includes various four wire ohmmeters. One such meter includes an operational amplifier having inputs and outputs coupled via first and second leads to respective terminals of an unknown resistor. One terminal of the unknown resistor also couples to a current source through a third lead; while the other terminal of the resistor couples to a voltage measuring device through a fourth lead. A problem with this four wire meter, however, is that its current source must deliver a predetermined current regardless of the unknown resistance, and thus the current source is expensive to construct. Typically, it includes an operational amplifier, three precision resistors, and a transistor.

Another prior art four wire ohmmeter includes an operational amplifier having its input and output coupled via first and second leads to respective terminals of the unknown resistor. A current source couples to the operational amplifier input terminal; a third lead couples one terminal of the unknown resistance to ground; and a fourth lead couples the other terminal of the unknown resistance to a voltage measuring device. This device eliminates errors caused by the lead resistance, however, it requires a power supply and ground reference for the operational amplifier and current source which are separate and isolated from the power supply and ground reference for the voltage measuring device. Accordingly, this four wire ohmmeter is expensive to construct. Also, it generates error terms due to a drift between the two power supplies. Further, this type meter cannot drive capacitive loads in shunt with the fourth wire since the capacity will be parallel to the unknown resistance and will have a large time constant.

Therefore, it is one object of the invention to provide an improved ohmmeter.

Another object of the invention is to provide a four wire ohmmeter which compensates for errors due to lead resistance.

Another object of the invention is to provide a four wire ohmmeter which requires only one power supply.

Another object of the invention is to provide a four wire ohmmeter for precisely measuring resistance by auto-zeroing error voltages due to lead resistance and reference voltage offsets between the components within the meter.

SUMMARY OF THE INVENTION

These and other objects are accomplished in accordance with the invention by an ohmmeter containing an operational amplifier having inputs and outputs coupled via first and second leads to respective terminals of an unknown resistance. A current source couples to the operational amplifiers input, and generates first and second voltages at respective terminals of the unknown resistance. A sensing circuit having third and fourth leads connect to respective terminals of the unknown resistance. The sensing circuit scales the first and second voltages to third and fourth voltages respectively. An output of the sensing circuit couples to an integrator, and the output of the integrator couples through an amplifier to a sample and hold circuit. During one time interval, the third voltage is selectively passed through the integrator, the amplifier, the sample and hold circuit, and back to a summing junction at the integrator input. This closed loop has a negative gain and thus any currents injected due to the third voltage are sensed by the amplifier and nulled by the feed back loop. The multiple of the third voltage which nulls the current at the summing junction is stored in the sample and hold circuit. During a second time interval, the fourth voltage plus the voltage stored by the sample and hold circuit is passed through the integrator and the amplifier. In response, a ramp shaped voltage is generated at the output of the amplifier which is proportional to the difference between the fourth voltage and the multiple of the third voltage which is held in the sample and hold circuit. This ramp shaped voltage is generated for a time period of predetermined duration and thus a reference point voltage is generated at the end of the time period. Additional circuits couple to the integrating circuit for reducing the reference point voltage at a predetermined rate and for measuring the time interval required to reduce the reference point voltage to the voltage held by the sample and hold circuit. Also included is a circuit for multiplying this measured time interval by a predetermined constant to thereby compute the resistance of the unknown resistor.

BRIEF DESCRIPTION OF THE DRAWING

The novel features characteristic of the invention, are set forth in the appended claims. The invention itself, however, as well as other features and advantages thereof will best be understood by reference to the following detailed description of particular embodiments when read in conjunction with the accompanying drawings, wherein:

DETAILED DESCRIPTION

Figure 1:
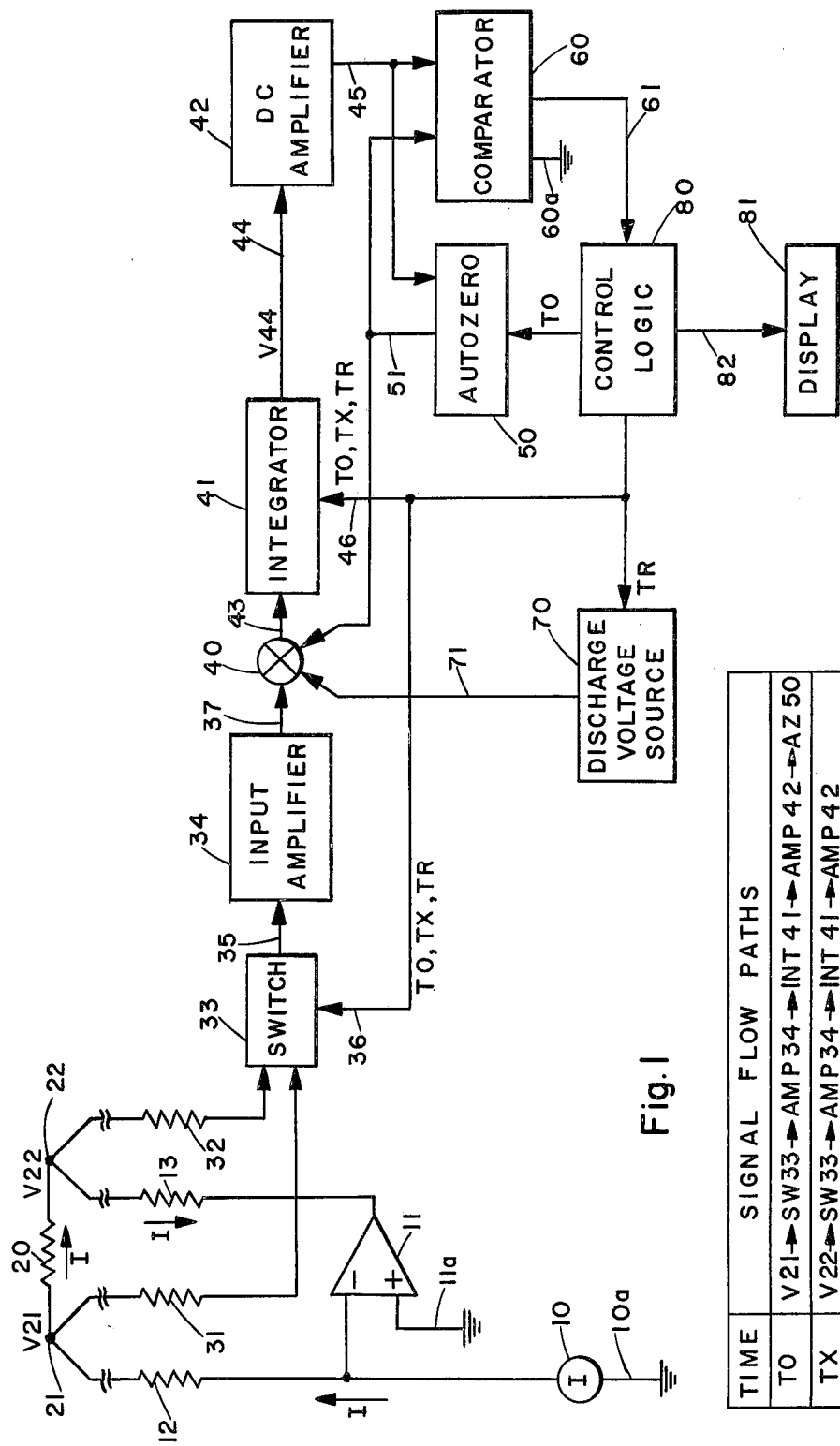
FIG. 1 is a block diagram of an ohmmeter constructed according to the invention.

With reference now to FIG. 1, a specific embodiment of an ohmmeter constructed according to the invention will be described. Included within the ohmmeter of FIG. 1 is a current circuit comprised of a current source 10, an inverting operational amplifier 11, and external leads 12 and 13. Current source 10 is suitably constructed of simply a resistor in series with a supply voltage. This resistor couples to an inverting input of operational amplifier 11 and to external lead 12. Operational amplifier 11 has a high input impedance and therefore all of current I supplied by current source 10 passes through external lead 12.

In operation, lead 12 connects to one terminal 21 of an external resistor 20 which is to be measured, and lead 13 couples to the other terminal 22 of resistor 20. As a result, current I passes into resistor 20 from lead 12 and is returned to the output of amplifier 11 via lead 13. Current I generates voltages V21 and V22 with respect to ground at its input and output terminals. Typically, voltage V21 is relatively small; and is generally in the microvolt or millivolt range. Although it is small, voltage V21 is non-zero and must be accounted for in order to accurately measure resistance 20. One factor contributing toward the non-zero value of voltage V21 is the resistance of lead 12, which is several feet long, times current I. Another factor which makes V21 non-zero is the difference in ground at various points in the ohmmeter. For example, ground 10a of current source 10 or ground 11a of operational amplifier 11 may be slightly different than ground 80a of a comparator 80 which physically is packaged a few inches away from current source 10 and operational amplifier 11. In measuring resistance 20, these ground differences must be accounted for since the voltage at the input or output terminal of resistance 20 will be slightly different depending upon its ground reference.

Also included within the ohmmeter of FIG. 1 is a circuit for selectively sensing and scaling voltages V21 and V22. This circuit includes leads 31 and 32, a 2×1 switch 33, and an input amplifier 34. In operation, lead 31 connects to terminal 21; and lead 32 connects to terminal 22. Typically, these leads are also several feet long and therefore have some small resistance as indicated. The signals on leads 31 and 32 are selectively passed by switch 33 to an output lead 35 under the control of logic signals T0 and TX on leads 36. Signals T0 and TX are timing signals which are utilized within the ohmmeter to control the flow of voltage signals V21 and V22 to various points within the meter. Specifically, signal T0 selectively passes voltage V21 through switch 33; while signal TX passes voltage V22 through switch 33. The output of switch 33 then couples via lead 35 to the input of an amplifier 34 which generates third and fourth voltages on a lead 37 in response to voltages V21 and V22 respectively.

The output of amplifier 34 couples via lead 37 to one input of a reference point voltage generating circuit. This circuit includes a summer 40, an integrator 41, and a DC amplifier 42. Components 40–42 are serially connected via leads 43 and 44. In operation, the signals received at the input of summer 40 are all DC voltages. Consequently, the input to integrator 41 is also a DC voltage and therefor the output of integrator 41 is a ramp shaped signal V44 which is generated on lead 44. Signal V44 is amplified by a gain of approximately 470 by amplifier 42. The resulting signal is generated on a lead 45.

The reference point voltage generating circuit also includes an auto-zero circuit 50. Lead 45 couples to the input of circuit 50, and the output of circuit 50 couples via lead 51 back to an input of summer 40. Timing signal T0 activates circuit 50. Basically in operation at time T0, voltage V21 is passed through switch 33, amplifier 34, summer 40, integrator 41, amplifier 42, and into auto-zero circuit 50. Also during time T0, circuit 50 passes the voltage on lead 45 to the lead 51. This signal flow is indicated in FIG. 1a. As a result of the feedback from circuit 50 and the negative gain of integrator 41, signal V44 is reduced approximately to zero. At the end of time T0, auto-zero circuit 50 samples and holds the voltage on lead 45. This voltage is remembered by circuit 50 and is placed on lead 51 during subsequent time intervals TX and TR.

During time interval TX, voltage V22 is passed through switch 33, summer 40, and into integrator 41. This is indicated in FIG. 1a. Simultaneously, the voltage on lead 51 passes through summer 40 and into integrator 51. As a result, voltage V44 ramps up at a rate proportional to the voltage difference V22 minus V21. And thus, at the end of time interval TX, voltage V44 and the output of amplifier 44 equal a reference point voltage whose magnitude with respect to the voltage on lead 51 indicates the value of resistance 20.

The disclosed ohmmeter also includes a discharge voltage source 70. During time interval TR, discharge voltage source 70 is activated. The output of source 70 couples via lead 71 to an input of summer 40 which in turn couples to integrator 41. During time interval TR, signals on lead 71 are integrated by integrator 41. By this process, the reference point voltage on lead 45 is reduced at a predetermined rate. Comparator 60 monitors the voltage on lead 45 and compares it to the voltage on lead 51. When the voltages on leads 51 and 45 are equal, comparator 60 generates a logic signal $\overline{\text{ZERO}}$ on a lead 61 which couples to a control logic circuit 80. Circuit 80 measures the time interval between the start of timing signal TR and the $\overline{\text{ZERO}}$ logic signal on lead 61. This time interval is a measure of resistance 20. Circuit 80 multiplies this time interval by a predetermined constant to thereby compute the value of resistance 20; and displays the result via a display 81.

Figure 2:
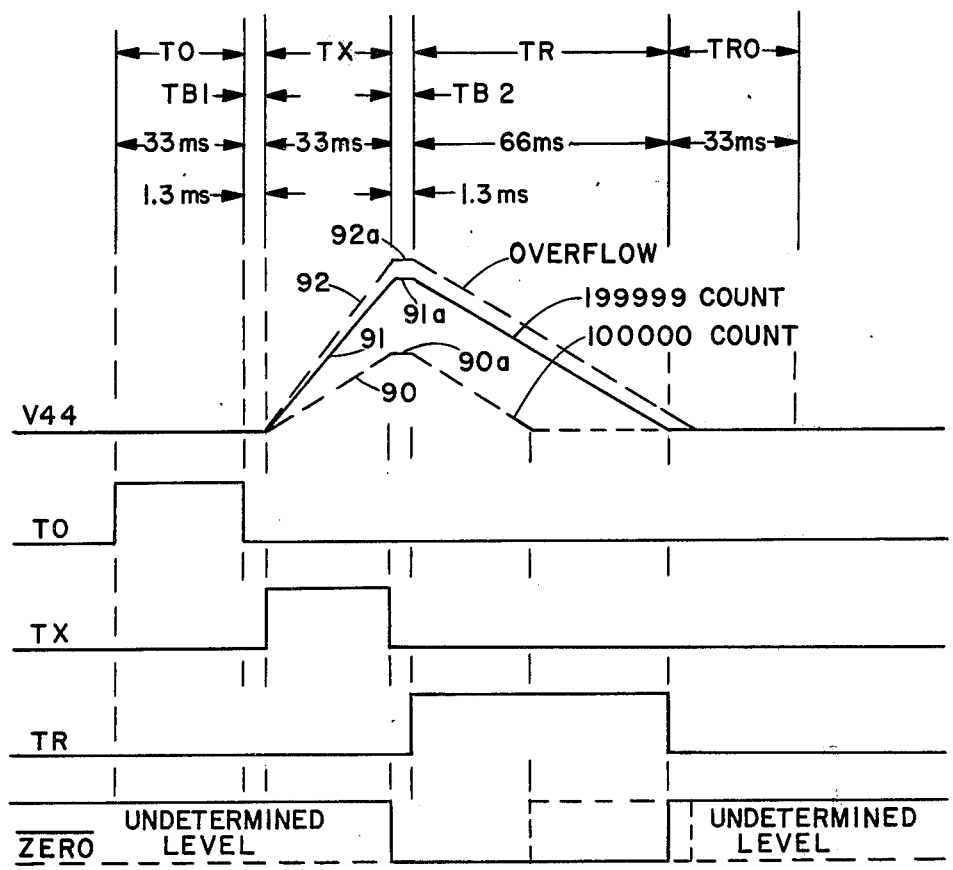
FIG. 2 is a timing diagram of signals at various points in the block diagram of FIG. 1.

Referring now to FIG. 2, there is illustrated a timing diagram of signals at various points in the above described ohmmeter. Specifically, timing signals T0, TX, and TR are illustrated as being non-overlapping pulses which respectively last for 33 milliseconds, 33 milliseconds, and 66 milliseconds. A timing interval of 1.3 milliseconds occurs between timing signals T0 and TX, TX and TR to allow for orderly switching of the signal flow paths. Also illustrated in FIG. 2, is the ramp shaped integrator output signal V44; and the logic output signal $\overline{\text{ZERO}}$ of comparator 60. During time interval T0, signal V44 is automatically adjusted to approximately zero as described above. During time interval TX, signal V44 ramps up at a rate proportional to the difference between voltages V22 and V21. Curves 90–92 illustrate three different rates of this ramping operation as an example. At the end of interval TX, reference points 90A–92A are generated, whose magnitude is proportional to resistance 20. During time interval TR, the reference point voltage is reduced at a predetermined rate until it equals the voltage on lead 51. While the reference point voltage is being reduced, logic circuit 80 counts clock pulses of predetermined frequency to thereby measure the time interval required to complete the discharge operation. In the illustrated example, reference point 90A discharges after a count of 100000. A count of 200000 is the maximum allowed. An overflow condition occurs when this count is exceeded. Curves 91 and 92 respectively illustrate a maximum count condition and overflow condition.

Figure 3:
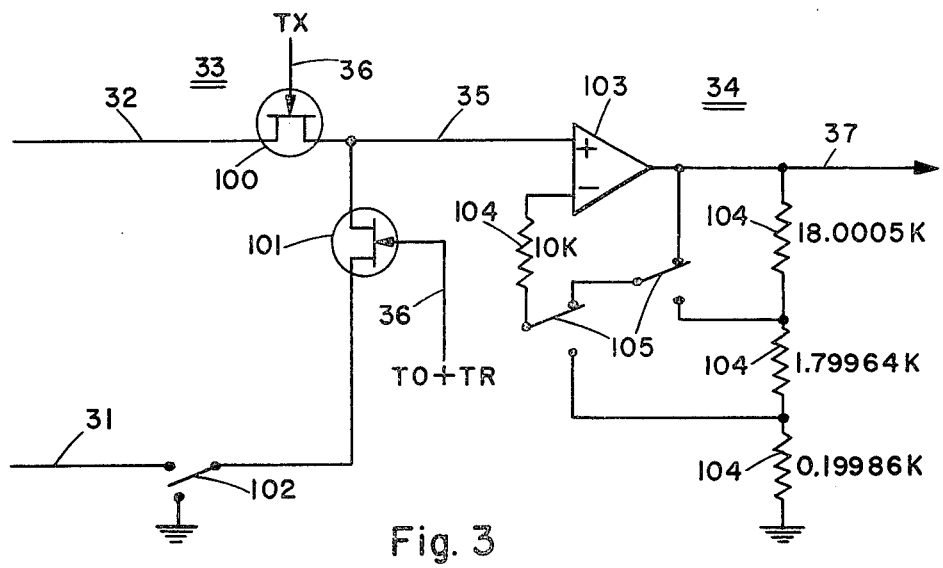
FIG. 3 is a detailed circuit diagram of a switch and input amplifier contained within the block diagram of FIG. 1.

FIGS. 3-6 contain details of each of the blocks of FIG. 1. These will now be separately described. Referring first to FIG. 3, a detailed circuit diagram of switch 33 and amplifier 34 is illustrated. Reference numerals 31-37 indicate corresponding points between FIG. 1 and FIG. 3. In switch 33, lead 32 couples to lead 35 through an J/FET transistor 100 having a gate coupled to receive logic signal TX. Similarly, lead 31 couples to lead 35 through a J/FET transistor 101 having a gate coupled to receive logic signal T0+TR. Serially included in this signal path is a manually operated switch 102. Switch 102 is provided to allow the disclosed ohmmeter to also operate as a voltmeter. When the device operates as a voltmeter, switch 102 couples transistor 101 to ground, whereas when the device operates as an ohmmeter, switch 102 couples transistor 101 to lead 31.

Included within input amplifier 34 is an operational amplifier 103. Amplifier 103 has a high input impedance and thus it draws none of the current I from connecting leads 31 and 32. The gain of amplifier 103 is determined by feedback resistors 104 and switches 105. These switches are manually operated to allow for adjustment when an overflow condition occurs as described above in conjunction with FIG. 2.

Figure 4:
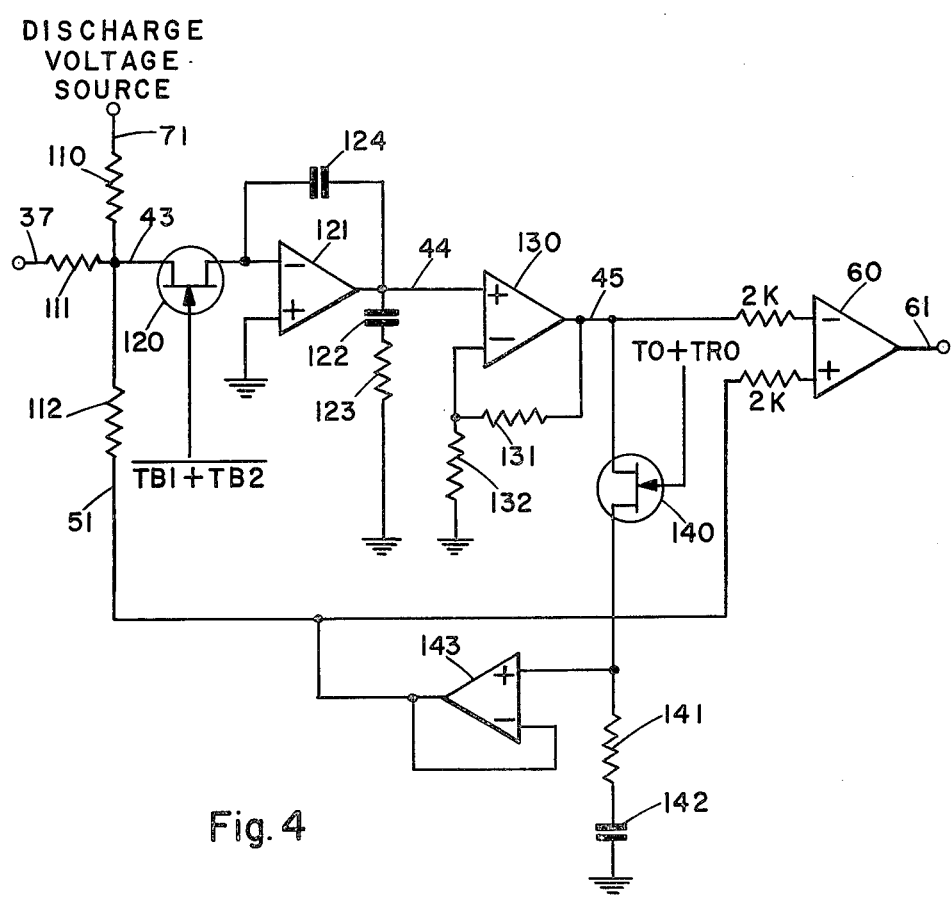
FIG. 4 is a detailed circuit diagram of an integrator, amplifier, comparator, and auto-zero circuit contained within the block diagram of FIG. 1.

Referring now to FIG. 4, the details of summer 40, integrator 41, DC amplifier 42, auto-zero circuit 50, and comparator 60 will be described. Each of these components is illustrated in detail in FIG. 4. Specifically, summer 40 is comprised of three 100k resistors, 110-112. These resistors connect to output lead 43. Integrator 41 is comprised of component 120-124. Component 120 is a J/FET transistor which is enabled at all times except during time intervals TB1 and TB2. Transistor 120 couples lead 43 to an inverting input of operational amplifier 121. A feedback capacitor 124 suitably of 0.47 microfarads makes amplifier 121 act as an integrator. A capacitor 122 and a resistor 123 serially couple the output of amplifier 121 to ground. These components act as a holding circuit for the output of amplifier 121 during time intervals TB1 and TB2. Suitably capacitor 122 is 0.47 microfarads and resistor 123 is 750 k.

DC amplifier 42 is comprised of components 130-132. Component 130 is an operational amplifier whose gain is determined by the relative values of resistances 131-132. Suitably, resistance 131 is 470 k and resistance 132 is 1 k. Utilizing this combination, the gain of amplifier 130 equals 470. Autozero circuit 50 is comprised of components 140-143. Component 140 is an J/FET transistor which is enabled during time periods T0 and TR0. Transistor 140 connects signals on lead 45 to a holding circuit comprised of a resistor 141 and a capacitor 142. Suitably, resistance 141 is 10 k and capacitor 142 is 1.0 microfarads. This holding circuit couples to a non-inverting input of an operational amplifier 143. Amplifier 143 has an output coupled back to its negative input to provide a gain of one. During time interval T0, signals from lead 45 are coupled through transistor 140 and through amplifier 143 back to the input of integrator 121. By this loop, the output of integrator 121 is reduced approximately to zero. For example, if the voltage on lead 37 is 1 volt, then the voltage on lead 51 will self adjust to minus 1 volt. Thus no current will pass through the integrator. As a modification, if resistors 111 and 112 respectively are 100 k and 200 k, then the voltage on lead 51 will self adjust to minus 2 volts so that no current flows through the integrator. At the end of time interval T0, the voltage on lead 45 is held in capacitor 142 and is applied subsequently through amplifier 143 to integrator 121 and to comparator 60.

Figure 5:
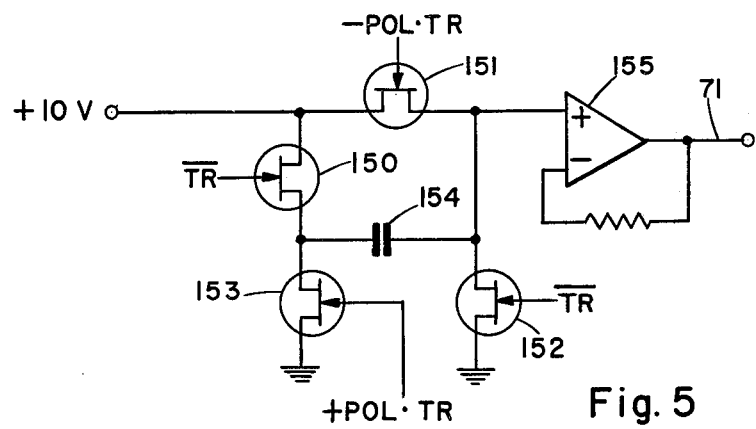
FIG. 5 is a detailed circuit diagram of a discharge voltage source contained within the block diagram of FIG. 1.

FIG. 5 is a detailed circuit diagram of discharge voltage source 70. This voltage source selectively generates either a positive or a negative voltage on lead 71, dependent upon the polarity of the reference point voltage at the end of time interval TX. Specifically, the voltage generator on lead 71 will always be of a polarity opposite to the reference point voltage to allow discharge of that voltage. When the disclosed device operates solely as an ohmmeter, the polarity of the reference point voltage is always negative and therefor a much simpler circuit may be used as the discharge voltage source. However, as previously indicated, the disclosed device may be used both as an ohmmeter and a voltmeter; and in the voltmeter mode of operation, the polarity of the reference point voltage is unpredictable. The circuit of FIG. 5 is suitably for the ohmmeter and voltmeter mode of operation. Basically, the discharge voltage source is comprised of four J/FET transistors 150-153, a capacitor 154, and an amplifier 155. During time intervals TR, transistors 150 and 152 conduct and thus couple capacitor 154 to a ten volt source. During time interval $\overline{TR}$, transistors 151 turns on only if the reference point voltage is of a negative polarity; whereas transistor 153 turns on only if the reference point voltage is of a positive polarity. Transistor 151 connects +10 volts to the input of amplifier 155, whereas transistor 153 inverts the stored voltage on capacitor 154 and connects it to the input of amplifier 155.

Figure 6:
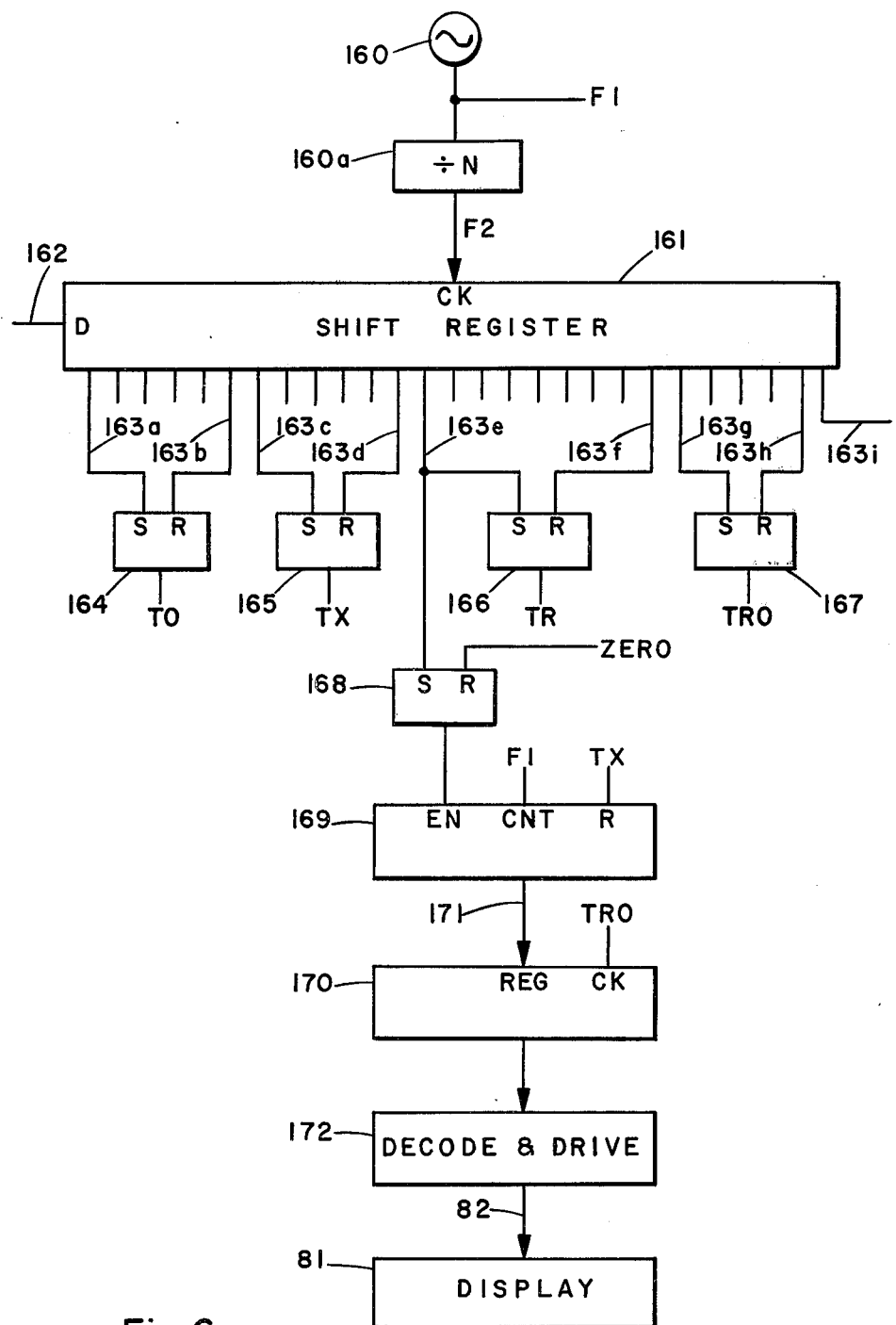
FIG. 6 is a detailed logic diagram of a control logic circuit contained within FIG. 1.

Referring now to FIG. 6, the details of control logic circuit 80 will be described. Circuit 80 includes an oscillator 160, a ÷N counter 160a, and a shift register 161. Signals F1 and F2 of predetermined frequency are generated by components 160 and 160a, and signal F2 clocks shift register 161. To form the timing signals T0, TX, ..., a 1 bit in input into shift register 161 via a D input lead 162. This 1 bit is subsequently shifted throughout shift register 161 at the frequency of signal F2. Register 161 has various output leads 163A-163I. 33 Milliseconds passes as the 1 bit shifts from output 163A to output 163B, or from output 163C to output 163D, or from output 163G to output 163H. Similarly, 1.3 milliseconds passes as the injected one bit shifts between outputs 163B and 163C, 163F and 163E, 163F and 163G. And, 66 milliseconds passes as the injected 1 bit shifts between outputs 163E and 163F. Signals on leads 163A-163H are utilized to set and reset flip-flops 164-167 as illustrated in FIG. 6. Flip-flops 164-167 respectively generate signals T0, TX, TR, and TR0. Lead 163E also couples to the set input of a flip-flop 168. Flip-flop 168 is reset by logic signal ZERO as generated by comparator 60. The output of flip-flop 166 couples to the enable input of a counter 169. Counter 169 is triggered by signals F1, and is reset by signals TX. Thus, counter 169 generates a count indicating the time interval required to discharge the reference voltage during time interval TR. The output of counter 169 couples to the input of a register 170 via leads 171. Register 170 is loaded at the start of time interval TR0.

The count loaded therein couples through a decode and drive circuit 172 to the display circuit 81.

A specific detailed embodiment of the invention and variations thereof have now been described. It is to be understood, however, that the invention is not to be limited to said details since many modifications and changes may be made thereto without departing from the nature and spirit and the invention. For example, switch 33 may include one resistor connected from lead 32 to ground, and another resistor connected from lead 31 to ground. With this modification, the sequence of FIG. 1a may be used by the FIG. 1 circuit to measure voltage across leads 31 and 32. Specifically, at time T0, a voltage proportional to the voltage on lead 31 would be stored by autozero circuit 50; while at time TX, integrator 41 would generate a ramp output signal V44 proportional to the difference between the voltages on lead 32 and the stored voltage.

Thus, since many changes and modifications may be made to the disclosed details, the invention is to be defined by the appended claims.

Having described my invention, I now claim:

1. An ohmmeter comprised of:
   current circuit means having first and second leads for connection to respective terminals of an unknown resistor to supply current thereto for generation of first and second voltages at said terminals;
   sensing circuit means having third and fourth leads for connection to said terminals of said unknown resistor for sensing and scaling said first and second voltage to third and fourth voltages respectively;
   reference point voltage generator means for producing during a time period of predetermined duration, a ramp voltage with a slope proportional to the difference between said fourth voltage and a multiple of said third voltage to thereby generate a reference point voltage at the end of said time period;
   means for reducing said reference point voltage at a predetermined rate and for measuring the time interval required to reduce said reference point voltage to said multiple of said third voltage; and
   means for multiplying said time interval by a predetermined constant to thereby compute the resistance of said unknown resistor.

2. An ohmmeter according to claim 1, wherein said reference point voltage generator means includes an integrator having inputs coupled to selectively receive said third voltage, said multiple of said third voltage, and said fourth voltage.

3. An ohmmeter according to claim 2, wherein said reference point voltage generator means further includes an auto-zero circuit means having an input selectively coupled to the output of said integrator, and having an output for generating thereon said multiple of said third voltage.

4. An ohmmeter according to claim 3, wherein said auto-zero circuit means generates said multiple of said third voltage such that it produces a current at said integrator input of equal but opposite polarity to the current produced at said integrator input by said third voltage.

5. An ohmmeter according to claim 4, wherein said auto-zero circuit is comprised of a sample and hold circuit selectively coupled to the output of said integrator, and a buffer amplifier connecting said sample and hold circuit to said integrator input.

6. A method of measuring electrical resistance comprised of the steps of:
   sending a current through said resistance to generate first and second voltage at respective terminals of said resistance,
   scaling said first and second voltages to generate third and fourth voltages respectively,
   integrating said fourth voltage minus a multiple of said third voltage for a predetermined time interval to generate a reference point voltage having a magnitude proportional to the difference between said first and second voltages,
   reducing said reference point voltage at a predetermined rate until it equals said multiple of said third voltage, and
   multiplying the time required to perform said reducing step by a predetermined constant to thereby compute said resistance.

7. A method according to claim 6, wherein said multiple is chosen such that said integral of said fourth voltage minus said multiple of said third voltage is proportional to the integral of the voltage across said resistance.

8. A method according to claim 6, wherein said multiple of said third voltage is sampled and held for subsequent integration with said fourth voltage and subsequent comparison with said reference point voltage.

* * * * *